US008290748B2

(12) United States Patent
Schumacher et al.

(10) Patent No.: US 8,290,748 B2
(45) Date of Patent: Oct. 16, 2012

(54) SENSOR INTERFACE WITH INTEGRATED CURRENT MEASUREMENT

(75) Inventors: Hartmut Schumacher, Freiberg (DE); Ruediger Karner, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 492 days.

(21) Appl. No.: 11/665,029

(22) PCT Filed: Aug. 3, 2005

(86) PCT No.: PCT/EP2005/053812
§ 371 (c)(1),
(2), (4) Date: Nov. 18, 2008

(87) PCT Pub. No.: WO2006/040203
PCT Pub. Date: Apr. 20, 2006

(65) Prior Publication Data
US 2009/0076760 A1    Mar. 19, 2009

(30) Foreign Application Priority Data
Oct. 8, 2004   (DE) .......................... 10 2004 049 084

(51) Int. Cl.
*H03F 1/26* (2006.01)
(52) U.S. Cl. ............. 702/189; 702/93; 702/104; 702/116
(58) Field of Classification Search .................... 702/93, 702/104, 116, 189; 73/1.39, 1.79, 535
See application file for complete search history.

(56) References Cited

U.S. PATENT DOCUMENTS

| 4,187,806 A * | 2/1980 | Schnurle et al. ............... 123/695 |
| 5,287,724 A | 2/1994 | White et al. |
| 5,526,687 A * | 6/1996 | Ueyanagi ................... 73/514.16 |
| 5,698,770 A | 12/1997 | Hanisko et al. |
| 6,121,838 A * | 9/2000 | Freeman et al. ............... 330/253 |
| 6,347,541 B1 * | 2/2002 | Maleki ............................ 73/1.38 |
| 6,722,203 B1 * | 4/2004 | Evans et al. ...................... 73/649 |
| 7,076,991 B2 * | 7/2006 | Umeda ........................... 73/1.39 |
| 7,231,325 B2 * | 6/2007 | Motz et al. ..................... 702/189 |

FOREIGN PATENT DOCUMENTS

| DE | 36 27 241 | | 2/1988 |
| DE | 3627241 | A * | 2/1988 |
| DE | 40 29 916 | | 3/1992 |
| DE | 100 41 736 | | 2/2002 |
| JP | 7081515 | | 3/1995 |
| JP | 8067227 | | 3/1996 |

OTHER PUBLICATIONS

Crispin et al. "English Machine Translation of DE 3627241 A", 02, 1988, pp. 1-13.*

* cited by examiner

*Primary Examiner* — Mohamed Charioui
*Assistant Examiner* — Elias Desta
(74) *Attorney, Agent, or Firm* — Kenyon & Kenyon LLP

(57) ABSTRACT

The invention creates a control and evaluation apparatus for different sensor units, having: a stabilized supply unit for supplying the sensor unit with electrical energy; an amplifier device for amplifying a sensor signal generated by the sensor unit, which signal is delivered to the amplifier device as an input signal, and for outputting a measured signal dependent on the sensor signal; and an output unit for outputting the amplified sensor signal as an output signal. The amplifier device contains an integrated measuring resistor for measuring a voltage drop produced by the sensor signal, the voltage drop being delivered to the amplifier device as the input signal. In addition, in a comparator unit downstream from the amplifier device, the measured signal is compared with a definable threshold value, the threshold value being adjustable as a function of the sensor unit being used.

12 Claims, 2 Drawing Sheets

SENSOR INTERFACE WITH INTEGRATED CURRENT MEASUREMENT

FIELD OF THE INVENTION

The present invention relates in general to a sensor interface for transferring sensor signals, a sensor unit, furnishing the sensor signals, being connectable via an interface to a control and evaluation unit. The present invention relates in particular to a control and evaluation apparatus having a sensor interface for controlling sensor units and for evaluating the signals furnished by the sensor units, which apparatus has a simple configuration.

The present invention relates specifically to a control and evaluation apparatus for a sensor device having: an energy supply unit for supplying the sensor unit with electrical energy; an amplifier device for amplifying a sensor signal generated by the sensor unit and for outputting an amplified measured signal dependent on the sensor signal; and an output unit for outputting the amplified sensor signal as an output signal.

BACKGROUND OF THE INVENTION

Conventional sensor units are connected via terminal units to evaluation apparatuses for evaluating the sensor signals. In conventional fashion, an interface for connecting the sensor unit to the evaluation unit is equipped with a large number of terminal units, in particular when a measuring resistor must be provided in order to evaluate one of the current signals furnished by the sensor unit.

A conventional circuit assemblage of this kind is shown in FIG. 2. The sensor unit, which can be embodied e.g. as a peripheral acceleration sensor (PAS), is connected via terminals 2 and 2'. Usually a sensor signal dependent on the measured effect is measured as a current signal, in the case depicted in FIG. 2 as a current $I_{PAS}$. For evaluation of the current signal and for further amplification of the measured signal obtained from the current signal, the current signal must be converted into a voltage signal. This purpose is usually served by a measuring resistor MW that is connected in series with sensor unit PAS. As shown in FIG. 2, measuring resistor MW is disposed between terminal 2 and a terminal 1. A voltage $U_{PAS}$ dropping across measuring resistor MW is delivered to an amplifier unit V via separate lines. The voltage $U_{PAS}$ dropping across measuring resistor MW is ultimately measured in amplifier unit V and outputted to an output unit A as an output signal a. A current $I_{PAS}$ dependent on acceleration values that are obtainable using sensor unit PAS can therefore be measurable via a voltage drop $U_{PAS}$ of this kind.

Sensor PAS is also connected, via terminal 2' and a terminal 1', to a system ground M. Because the voltage drop also depends on the supply voltage $U_0$ that is made available, which is made available between terminal 1 and terminal 1', it is necessary that supply voltage $U_0$ not be subject to any fluctuations. Conventional methods use a support capacitor C, connected between terminal 1 and ground M (see FIG. 2), to compensate for voltage fluctuations that may be produced by factors such as external interference. The supply voltage is usually obtained from a battery unit B. Inserted between battery unit B and terminal 1 is a mispolarity protection unit VS which ensures that inadvertent mispolarities of the supply voltage do not damage downstream electronic components or the sensor unit.

Be it noted that one skilled in the art knows how to design an amplifier unit V in order to amplify a voltage difference signal $U_{PAS}$ delivered to the amplifier unit, and how to make an output signal a available at output A of amplifier unit V, so that a detailed explanation of amplifier unit V is omitted here.

Measurement systems that use sensor units PAS must be designed in variable fashion so that sensor units PAS are exchangeable. Because of production tolerances, however, it is impossible to obtain sensor units PAS that generate exactly reproducible currents $I_{PAS}$ as a function of a measured signal (e.g. an acceleration signal). For this reason, in conventional circuit assemblages measuring resistor MW must likewise be exchanged or replaced in the event of an exchange or replacement of sensor device PAS. This results in considerable complexity in terms of circuit engineering, thereby disadvantageously increasing the cost of the entire circuit assemblage. It is critical In safety-relevant applications, moreover, if measuring resistor MW must be exchanged along with sensor unit PAS, since errors in allocating measuring resistor MW to sensor unit PAS can easily occur.

A further disadvantage with the conventional sensor evaluation apparatus is that both sensor unit PAS and measuring resistor MW must be exchanged, since at least three terminal pins—i.e. terminals 1, 2, and 2' in FIG. 2—must be reconnected in this context. In a conventional measuring system, the control and evaluation apparatus thus creates a need for two terminal units to the electronic circuit assemblage, and a ground terminal for connection to ground M, at the interface between sensor unit PAS and the control and evaluation apparatus. The terminal pins (terminal units) for connection to the electronic circuit unit are labeled in FIG. 2 with the reference characters 1 and 2, while the ground connection terminal (terminal pin) is identified by the reference characters 1' and 2'.

Because the conventional control and evaluation apparatus is operated with mispolarity protection unit VS using a non-stabilized battery voltage B, it is disadvantageously necessary to make available, at the output of the energy supply unit (which is made up of battery B and mispolarity protection device VS), a capacitor C that is connected between an energy supply terminal E and ground M. In conventional systems, a smoothed energy supply voltage $U_0$ is generated in this fashion.

SUMMARY OF THE INVENTION

It is an object of the present invention to make available a control and evaluation apparatus for sensor units that has a simplified circuit configuration with a reduced number of terminal units for an interface unit.

This object is achieved, according to the present invention, by a control and evaluation apparatus for a sensor unit.

The object is furthermore achieved by a method according to the present invention.

An important idea of the present invention consists in simplifying an interface unit that is made available between the sensor unit and the remainder of the circuit assemblage by integrating a required series resistor (measuring resistor) into the input amplifier of the control and evaluation apparatus, placing downstream from the internal amplifier device a comparator unit that is acted upon by a definable threshold value. The threshold value is adjusted as a function of the sensor unit that is used. The control and evaluation apparatus according to the present invention has the particular advantage that the interface unit is simplified, and that different sensor units having different current/voltage characteristics can be connected. For that purpose, the amplifier device has downstream from it a comparator unit with which a measured signal outputted by the amplifier device can be compared with a definable threshold value, the threshold value being adjustable as a function of the sensor unit that is used.

Because the control and evaluation apparatus furthermore encompasses a stabilized energy supply unit, it is usefully possible to dispense with smoothing capacitors such as those necessary in the existing art. The advantage further exists that output-stage transistors in the sensor unit can be designed for lower currents, since less power dissipation occurs in the event of a short circuit of a supply voltage, made available by the stabilized energy supply unit, that is lower as compared with apparatuses according to the existing art.

The control and evaluation apparatus according to the present invention for different sensor units is substantially made up of:

a) a stabilized energy supply unit for supplying the sensor unit with electrical energy;
b) an amplifier device for amplifying a sensor signal generated by the sensor unit, which signal is delivered as an input signal to the amplifier device, and for outputting a measured signal dependent on the sensor signal; and
c) an output unit for outputting the amplified sensor signal as an output signal, a measuring resistor integrated into the amplifier device furthermore being made available, with which resistor a voltage drop produced by the sensor signal is measured in such a way that the voltage drop is delivered to the amplifier device as the input signal.

A comparator unit downstream from the amplifier device furthermore ensures that the measured signal can be compared with a definable threshold value, in which context the threshold value can be adjusted as a function of the sensor unit being used.

The method according to the present invention for controlling different sensor units, and for evaluating sensor signals that are furnished by a respective sensor unit as a function of a measured variable, furthermore encompasses substantially the following steps:

a) supplying the sensor unit with electrical energy from a stabilized energy supply unit;
b) amplifying a sensor signal generated by the sensor unit, which signal is delivered to an amplifier device as an input signal in order to obtain a measured signal using the amplifier made available in the control and evaluation apparatus; and
c) outputting the measured signal dependent on the sensor signal from the amplifier device using an output unit, a voltage drop produced by the sensor signal being measured using a measuring resistor integrated into the amplifier device, the voltage drop being delivered to the amplifier device as the input signal. The measured signal is furthermore compared with a definable threshold value using a comparator unit downstream from the amplifier device, the threshold value being adjusted as a function of the sensor unit being used.

According to a preferred refinement of the present invention, the sensor unit is embodied as a peripheral acceleration sensor (PAS).

According to yet another preferred refinement of the present invention, a memory unit is made available for storage of the definable threshold value. Advantageously, the threshold value is stored beforehand in the memory unit, in order to allow different sensor units to be connected via the interface unit to the control and evaluation apparatus.

In a further aspect of the present invention, the supply unit for supplying the sensor unit with electrical energy is embodied as a stabilized voltage source for outputting a stabilized supply voltage. According to yet another preferred refinement of the present invention, the amplifier device has a temperature-compensated instrumental amplifier.

Advantageously, the stabilized supply voltage is generated using a stabilized voltage source of the energy supply unit for supplying the sensor unit.

The stabilized voltage source preferably makes available a stabilized supply voltage in a range from 6 to 7 volts.

According to yet another preferred refinement of the present invention, the comparator unit for comparing the measured signal is acted upon by different threshold values as a function of the sensor unit being used.

Such a configuration of the control and evaluation apparatus makes it possible to connect different sensor units efficiently and with a reduced circuit complexity, ensuring reliable transfer and evaluation of the sensor signals.

BRIEF DESCRIPTION OF THE DRAWINGS

Exemplifying embodiments of the invention are depicted in the drawings and explained in more detail in the description that follows.

DETAILED DESCRIPTION

Figure 1:
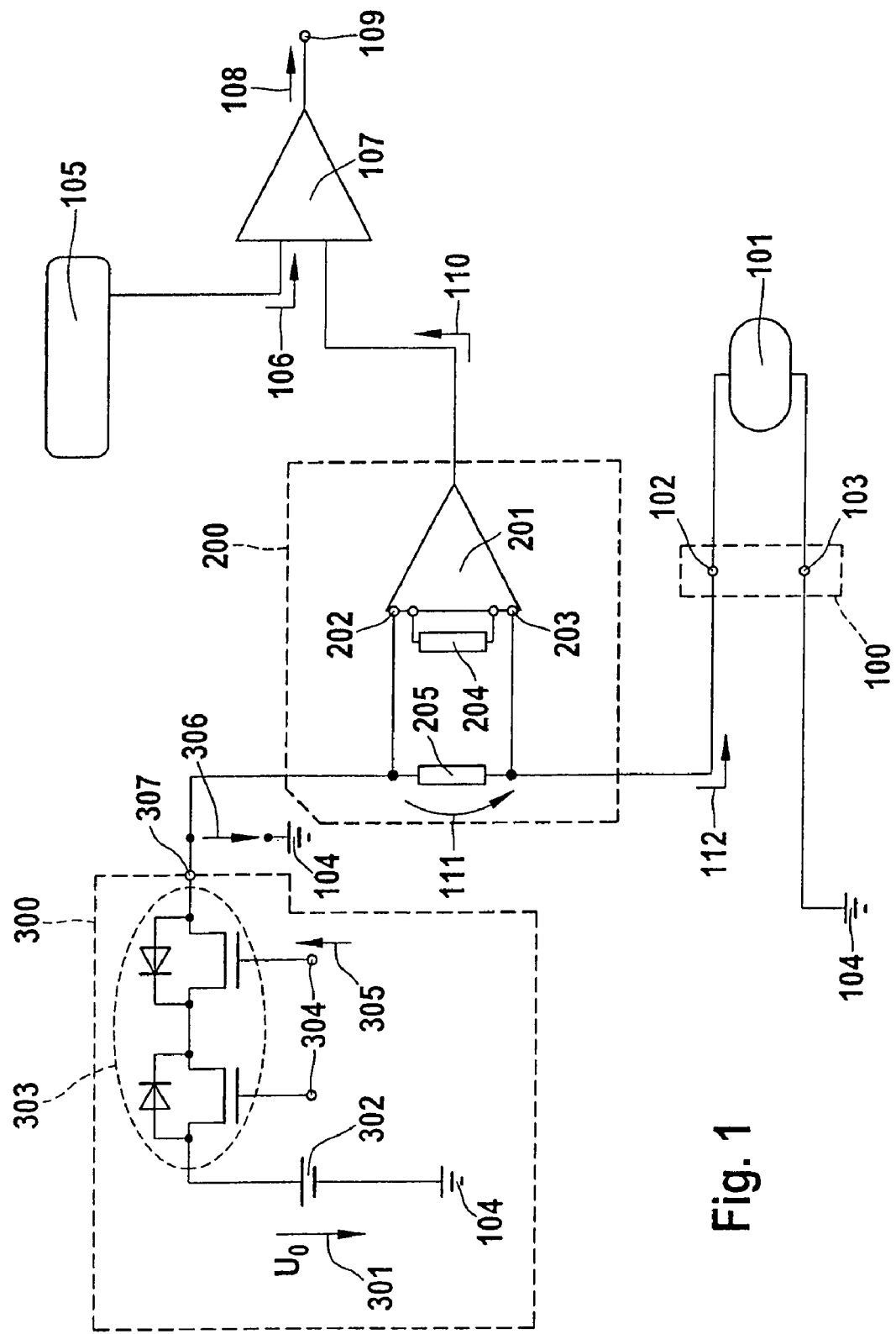
FIG. 1 is a block diagram of a control and evaluation apparatus according to the present invention having a sensor unit connected via an interface-unit, according to a preferred exemplifying embodiment of the present invention.

FIG. 1 is a block diagram of a control and evaluation apparatus according to the present invention for controlling a sensor unit 101 and for evaluating sensor signals 112 that are furnished by sensor unit 101 as a function of a measured variable. Sensor unit 101 is connected via an interface unit 100 to the remainder of the circuit assemblage. According to the present invention, interface unit 100 makes available a first sensor terminal 102 and a second sensor terminal 103. Sensor unit 101 is connected via second sensor terminal 103 to ground 104. In addition to ground terminal 103, only first sensor terminal 102 is necessary for the connection of sensor unit 101.

It should be noted—although this is not illustrated in FIG. 1—that the remainder of the circuit assemblage, except for sensor unit 101 and interface unit 100, can be made available as an integrated circuit assemblage.

A reference number 300 designates an energy supply unit, and a reference number 200 designates an amplifier device. Energy supply unit 300 serves substantially to make available a constant stabilized supply voltage 306 for the operation of sensor unit 101. For that purpose, energy supply unit 300 has a supply voltage source 302 that makes available a supply voltage 301 ($U_0$).

Control of the supply voltage 301 furnished by supply voltage source 302 is effected via a switch unit 303 that is made available, for example, as a series resistor. For that purpose, switch unit 303 has a "back-to-back" transistor circuit that can be influenced by an on/off switching signal 305. A back-to-back configuration of the switching transistors is common knowledge to one skilled in the art (mispolarity protection), so that a detailed depiction of voltage stabilization unit 303 is omitted here.

At a supply terminal unit 307, stabilized supply voltage 306 is now made available between supply terminal unit 307 and ground 104.

Stabilized supply voltage 306 is likewise present between first sensor terminal 102 of interface unit 100 and ground 104, as illustrated in FIG. 1. Sensor unit 101, which can be embodied e.g. as a peripheral acceleration sensor (PAS), furnishes a sensor signal 112 that is dependent on a measured variable, for example an acceleration value. The sensor signal is embodied in sensors of this kind as a current signal having a baseline current of 5 mA (milliamperes) and a current swing of 20 mA. It is thus possible, as a function of the measured variable, to generate a bit pattern that can be further processed in downstream amplifier and comparator devices.

Sensor unit 101 can be made available in this context as a micromechanical acceleration sensor that is disposed in motor vehicles, for example, in the B column or as an up-front sensor, and furnishes acceleration values e.g. for the actuation of airbags, belt tensioners, etc. Sensor signal 110 is usually made available as a 10-bit value. For further processing of sensor signal 112 embodied as a current signal, it is advantageous to convert it into a voltage drop 111, so that an amplifier device 200 embodied as an instrumental amplifier can advantageously be used.

Voltage drop 111 produced by sensor signal 112 is obtained using a measuring resistor 205 through which the current signal (sensor signal) 112 is directed. According to the present invention, measuring resistor 205 is made available in integrated fashion together with amplifier device 200, in such a way that sensor unit 101 needs to be connected only via first and second sensor terminals 102 and 103, respectively, with no need to provide a corresponding measuring resistor 205 that is associated with a sensor unit 101. Because different sensor units 101 may produce different voltage drops 111 for the same measured variable when measuring resistance 205 is kept constant, according to the present invention a comparator unit 107 is made available which receives threshold values 106 from a memory unit, so that a measured signal 110 furnished by amplifier device 200 can be compared with threshold value 106. The provision of different threshold values 106 for corresponding sensor units 101 makes it possible to dispense entirely with adaptation of the measuring resistance 205. Amplifier device 200 encompasses, in detail, a differential amplifier 201 whose gain factor can be adjusted using an adjusting resistor 204. The measuring resistor is connected between a first input terminal 202 and a second input terminal 203 of differential amplifier 201, in which context first and second input terminals 202 and 203 can be made available as a "minus" input terminal and a "plus" input terminal, respectively. Measured signal 110 furnished by amplifier device 200 thus constitutes an indication of the amplified sensor signal 112.

Although this is not illustrated in FIG. 1, it should be noted that according to a further preferred embodiment of the present invention, a detection of sensor unit 101 can be made available by the fact that upon connection of a sensor unit 101 to interface unit 100, a threshold value 106 associated with the corresponding sensor unit 101 can automatically be outputted from memory unit 105. This ensures that measured signal 110 is always compared with the correct threshold value 106 associated with a sensor unit 101.

Comparator unit 106, with which a comparison of this kind is performed, makes available a comparison result, as an output signal 108, to an output terminal unit 109. Output signal 108 furnishes, for example, a triggering signal for an airbag, acceleration values being acquired with the corresponding sensor unit 101.

Threshold value 106 is preferably stored beforehand in the memory unit, so that the threshold value can be efficiently made available as a function of the type of sensor unit 101 being used. It is therefore possible for comparator unit 107 to compare measured signal 110 outputted from amplifier device 200 with different threshold values 106 depending on the sensor unit 101 being used.

The apparatus according to the present invention yields the advantage that an external measuring resistor is eliminated. It is additionally possible to eliminate support capacitor C described with reference to FIG. 2. The advantage furthermore exists that the entire measuring system becomes less sensitive to fluctuations in the supply voltage.

Advantageously, the measuring resistor is integrated into the remainder of the circuit assemblage, for example an application-specific integrated circuit (ASIC). Voltage drop 111 through a measuring resistor 205 of this kind, measured with amplifier device 200 embodied as a temperature-compensated instrumental amplifier, is strictly proportional to the sensor signal 112 (current signal) produced by sensor unit 101.

Adaptation of the resistances for amplification adjustment, and provision of a comparator unit 107 for a comparison of measured signal 110 with different threshold values 106, makes possible an adaptation to different sensor units 101 with no need for a modification of measuring resistor 205 itself. Measuring resistor 205 can thus be efficiently integrated into the overall system.

Figure 2:
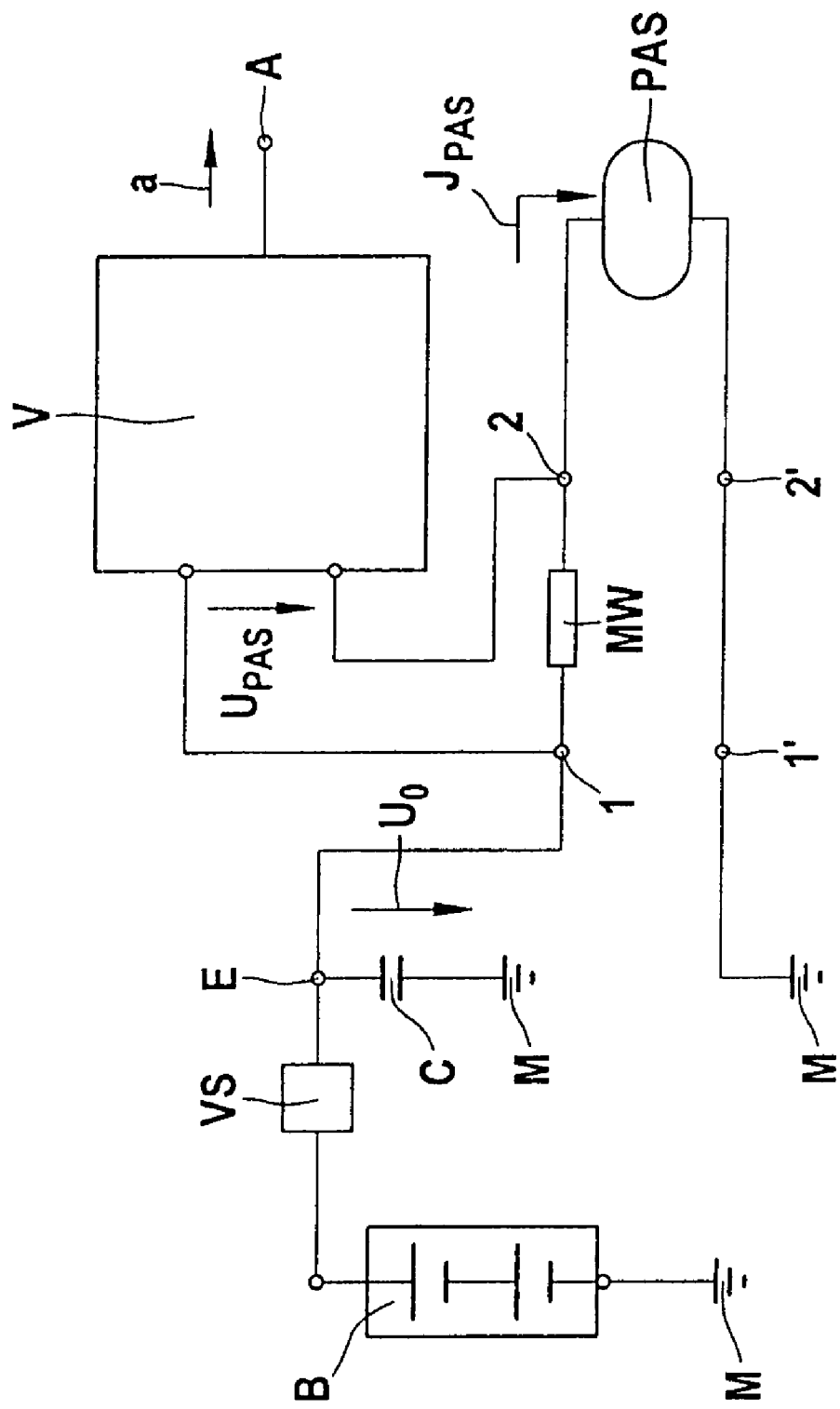
FIG. 2 shows a conventional circuit arrangement with a sensor unit connected.

With respect to the conventional circuit assemblage, depicted in FIG. 2, for controlling a sensor unit and for evaluating the sensor signals furnished thereby, the reader is referred to the introductory description.

Although the present invention has been described above with reference to preferred exemplifying embodiments, it is not limited thereto but rather is modifiable in numerous ways.

The invention is also not limited to the aforementioned application capabilities.

LIST OF REFERENCE CHARACTERS

In the Figures, identical reference characters identify identical or functionally identical components or steps.
100 Interface unit
101 Sensor unit
102 First sensor terminal
103 Second sensor terminal
104 Ground
105 Memory unit
106 Threshold value
107 Comparator unit
108 Output signal
109 Output terminal unit
110 Measured signal
111 Voltage drop
112 Sensor signal
200 Amplifier device
201 Differential amplifier
202 First input terminal
203 Second input terminal
204 Adjusting resistor
205 Measuring resistor
300 Energy supply unit
301 Supply voltage
302 Supply voltage source
303 Voltage stabilization unit
304 Stabilization input
305 Stabilization signal
306 Stabilized supply voltage
307 Supply terminal unit

What is claimed is:
1. A control and evaluation apparatus for different sensor units, comprising:
a stabilized energy supply unit for supplying the sensor units with electrical energy;

an amplifier device for amplifying a sensor signal generated by a selected one of the sensor units, which signal is delivered to the amplifier device as an input signal, and for outputting a measured signal dependent on the sensor signal;

an output unit for outputting the measured signal as an output signal;

a measuring resistor, incorporated within the amplifier device, for measuring a voltage drop produced by the sensor signal, the voltage drop being delivered to the amplifier device as the input signal; and a comparator unit, downstream from the amplifier device, for comparing the measured signal with a threshold value selected from a plurality of stored threshold values, wherein each of the different sensor units is assigned a corresponding stored threshold value, the selected threshold value being assigned to the selected sensor unit being used.

2. The apparatus of claim 1, wherein the selected sensor unit is a peripheral acceleration sensor (PAS).

3. The apparatus of claim 1, further comprising: a memory unit to store the plurality of stored threshold values.

4. The apparatus of claim 1, wherein the energy supply unit includes a stabilized voltage source for outputting a stabilized supply voltage.

5. The apparatus of claim 1, wherein the amplifier device includes a temperature-compensated instrumental amplifier.

6. A method for controlling different sensor units, and for evaluating sensor signals that are furnished by a respective one of the different sensor units as a function of a measured variable, in a control and evaluation apparatus, the method comprising:

supplying the sensor units with electrical energy from a stabilized energy supply unit;

amplifying, using an amplifier device in the control and evaluation apparatus, a sensor signal by a selected sensor unit, which signal is provided to the amplifier device as an input signal to obtain a measured signal;

outputting the measured signal dependent on the sensor signal from the amplifier device using an output unit;

measuring, using a measuring resistor incorporated within the amplifier device, a voltage drop by the sensor signal, the voltage drop being provided to the amplifier device as the input signal; and comparing the measured signal with a selected threshold value using a comparator unit downstream from the amplifier device, wherein the selected threshold value is selected from a plurality of stored threshold values, and wherein each of the different sensor units is assigned a corresponding stored threshold value, the selected threshold value being assigned to the selected sensor unit being used.

7. The method of claim 6, wherein the stored threshold values are stored in a memory unit.

8. The method of claim 7, wherein the selected threshold value is defined as a function of a type of the sensor unit being used.

9. The method of claim 6, wherein a stabilized supply voltage is outputted from the energy supply unit for supplying the sensor unit with electrical energy.

10. The method of claim 9, wherein the stabilized supply voltage is generated using a stabilized voltage source of the energy supply unit for supplying the sensor unit.

11. The method of claim 10, wherein the stabilized voltage source makes available a stabilized supply voltage in a range from 6 to 7 volts.

12. The method of claim 11, wherein the selected threshold value used by the comparator unit is defined as a function of a type of the sensor unit being used.

* * * * *